United States Patent
Tang et al.

(10) Patent No.: US 9,318,430 B2
(45) Date of Patent: Apr. 19, 2016

(54) STACK OF HORIZONTALLY EXTENDING AND VERTICALLY OVERLAPPING FEATURES, METHODS OF FORMING CIRCUITRY COMPONENTS, AND METHODS OF FORMING AN ARRAY OF MEMORY CELLS

(71) Applicant: Micron Technology, Inc., Boise, ID (US)

(72) Inventors: Sanh D. Tang, Boise, ID (US); Roger W. Lindsay, Boise, ID (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/602,559

(22) Filed: Jan. 22, 2015

(65) Prior Publication Data

US 2015/0129935 A1    May 14, 2015

Related U.S. Application Data

(62) Division of application No. 13/085,083, filed on Apr. 12, 2011, now Pat. No. 8,945,996.

(51) Int. Cl.
*H01L 23/52* (2006.01)
*H01L 27/10* (2006.01)

(52) U.S. Cl.
CPC ............... *H01L 23/52* (2013.01); *H01L 27/10* (2013.01); *H01L 27/101* (2013.01); *H01L 2924/0002* (2013.01)

(58) Field of Classification Search
CPC ............ H01L 27/10; H01L 27/1157; H01L 27/11578; H01L 21/8221
USPC ............... 438/216, 261, 591, 270–273, 639
See application file for complete search history.

(56) References Cited

U.S. PATENT DOCUMENTS

| 5,414,285 A | 5/1995 | Nishihara |
| 6,023,099 A | 2/2000 | Komuro |

(Continued)

OTHER PUBLICATIONS

Katsumata et al., "Pipe-shaped BiCS Flash Memory with 16 Stacked Layers and Multi-Level-Cell Coperation for Ultra High Density Storage Devices", Toshiba Corporation, 2009 Symposium on VLSI Technology Digest of Technical Papers, pp. 136-137.

(Continued)

*Primary Examiner* — Cuong Q Nguyen
(74) *Attorney, Agent, or Firm* — Wells St. John, P.S.

(57) ABSTRACT

A method of forming circuitry components includes forming a stack of horizontally extending and vertically overlapping features. The stack has a primary portion and an end portion. At least some of the features extend farther in the horizontal direction in the end portion moving deeper into the stack in the end portion. Operative structures are formed vertically through the features in the primary portion and dummy structures are formed vertically through the features in the end portion. Horizontally elongated openings are formed through the features to form horizontally elongated and vertically overlapping lines from material of the features. The lines individually extend from the primary portion into the end portion, and individually laterally about sides of vertically extending portions of both the operative structures and the dummy structures. Sacrificial material that is elevationally between the lines is at least partially removed in the primary and end portions laterally between the horizontally elongated openings. Other aspects and implementations are disclosed.

19 Claims, 18 Drawing Sheets

(56) References Cited

U.S. PATENT DOCUMENTS

| | | |
|---|---|---|
| 6,472,735 B2 | 10/2002 | Isaak |
| 7,446,038 B2 | 11/2008 | Jeng |
| 9,034,710 B2 * | 5/2015 | Sills .................. H01L 45/04 438/277 |
| 2006/0148171 A1 | 7/2006 | Lee |
| 2009/0309152 A1 | 12/2009 | Knoefler et al. |
| 2012/0003831 A1 | 1/2012 | Kang et al. |
| 2012/0052674 A1 | 3/2012 | Lee et al. |
| 2014/0106569 A1 | 4/2014 | Oh et al. |
| 2014/0162420 A1 | 6/2014 | Oh et al. |
| 2014/0179068 A1 * | 6/2014 | Samachisa ......... G11C 13/0002 438/128 |

OTHER PUBLICATIONS

Komori et al., "Disturbless Flash Memory due to High Boost Efficiency on BiCS Structure and Optimal Memory Film Stack for Ultra High Density Storage Device", Center for Semiconductor Research & Development, Toshiba Coporation, IEEE, 2008, pp. 851-854.

Niklaus et al., "Wafer-Level 3D Integration Technology Platforms for ICs and MEMS", Research Paper, Center for Integrated Institute, Rennsselaer Polytechnic Institute (RPI); Jan. 2005; 8 pp.

* cited by examiner

STACK OF HORIZONTALLY EXTENDING AND VERTICALLY OVERLAPPING FEATURES, METHODS OF FORMING CIRCUITRY COMPONENTS, AND METHODS OF FORMING AN ARRAY OF MEMORY CELLS

RELATED PATENT DATA

This patent resulted from a divisional application of U.S. patent application Ser. No. 13/085,083, filed Apr. 12, 2011, entitled "Stack Of Horizontally Extending And Vertically Overlapping Features, Methods Of Forming Circuitry Components, And Methods Of Forming An Array Of Memory Cells", naming Sanh D. Tang, Roger W. Lindsay, and Krishna K. Parat as inventors, the disclosure of which is incorporated by reference.

TECHNICAL FIELD

Embodiments disclosed herein pertain to stacks of horizontally extending and vertically overlapping features, and to methods of forming circuitry components and to methods of forming an array of memory cells.

BACKGROUND

Integrated circuits are often formed on a semiconductor substrate such as a silicon wafer or other semiconductive material. In general, layers of various materials which are semiconductive, conductive, or electrically insulative are utilized to form the integrated circuits. By way of examples, the various materials may be doped, ion implanted, deposited, etched, grown, etc. using various processes. A continuing goal in semiconductive processing is to strive to reduce the size of individual circuitry components, thereby enabling smaller and denser integrated circuitry.

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, the smallest unit in each array is termed as a memory cell and is configured to store data as one of at least two different selectable states. In a binary system, the states are considered as either a "0" or a "1". In other systems, at least some individual memory cells may be configured to store data as one of more than two selectable states.

Integrated circuitry fabrication continues to strive to produce smaller and denser integrated circuits. Accordingly, the fewer components an individual circuit device has, the smaller the construction of the finished device can be. A simple memory cell will be comprised of two conductive electrodes having a programmable material there-between. The programmable material is selected or designed to be configured in a selected one of at least two different physical memory states to enable storing of information by an individual memory cell. The reading of the cell comprises determination of which of the states the programmable material is in, and the writing of information to the cell comprises placing the programmable material in a target memory state. Some programmable materials retain a memory state in the absence of refresh, and thus may be incorporated into nonvolatile memory cells.

Some programmable materials may contain mobile charge carriers larger than electrons and holes, for example ions in some example applications. Regardless, the programmable materials may be converted from one memory state to another by moving the mobile charge carriers to alter a distribution of charge density within the programmable materials. Some example memory devices that utilize ions as mobile charge carriers are resistive RAM (RRAM) cells, which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other).

A PMC may similarly have programmable material sandwiched between a pair of current conductive electrodes. The PMC programmable material comprises ion conductive material, for example a suitable chalcogenide or any of various suitable oxides. A suitable voltage applied across the electrodes generates current conductive super-ionic clusters or filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across the electrodes essentially reverses the process and thus removes the current conductive paths. A PMC thus comprises a high resistance state (corresponding to the state lacking a current conductive filament or clusters between the electrodes) and a low resistance state (corresponding to the state having a current conductive filament or clusters between the electrodes), with such states being reversibly interchangeable with one another.

Another type of nonvolatile memory is known as flash memory, a type of EEPROM (electrically-erasable programmable read-only memory) that may be erased and reprogrammed in groups. A typical flash memory array includes a large number of nonvolatile memory cells usually grouped into blocks. Each of the cells within a block may be electrically programmed by charging its programmable gate material. The charge may be removed from the programmable gate material by a block erase operation. NAND is a basic architecture of flash memory. A NAND architecture comprises at least one select gate coupled in series to a serial combination of memory cells (with the serial combination being commonly referred to as a NAND string).

DETAILED DESCRIPTION OF EXAMPLE EMBODIMENTS

Example embodiments in accordance with the invention of methods of forming circuitry components are initially described with reference to FIGS. 1-10. In some embodiments, an array of memory cells may be fabricated, for example as described with reference to FIGS. 1-13 and with reference to FIGS. 14-17. In one embodiment, such may comprise cross-point memory cells (e.g., as shown in FIG. 17), and in one embodiment may comprise NAND circuitry (e.g., as shown in FIGS. 11, 11A, 12, and 13).

Figure 1:
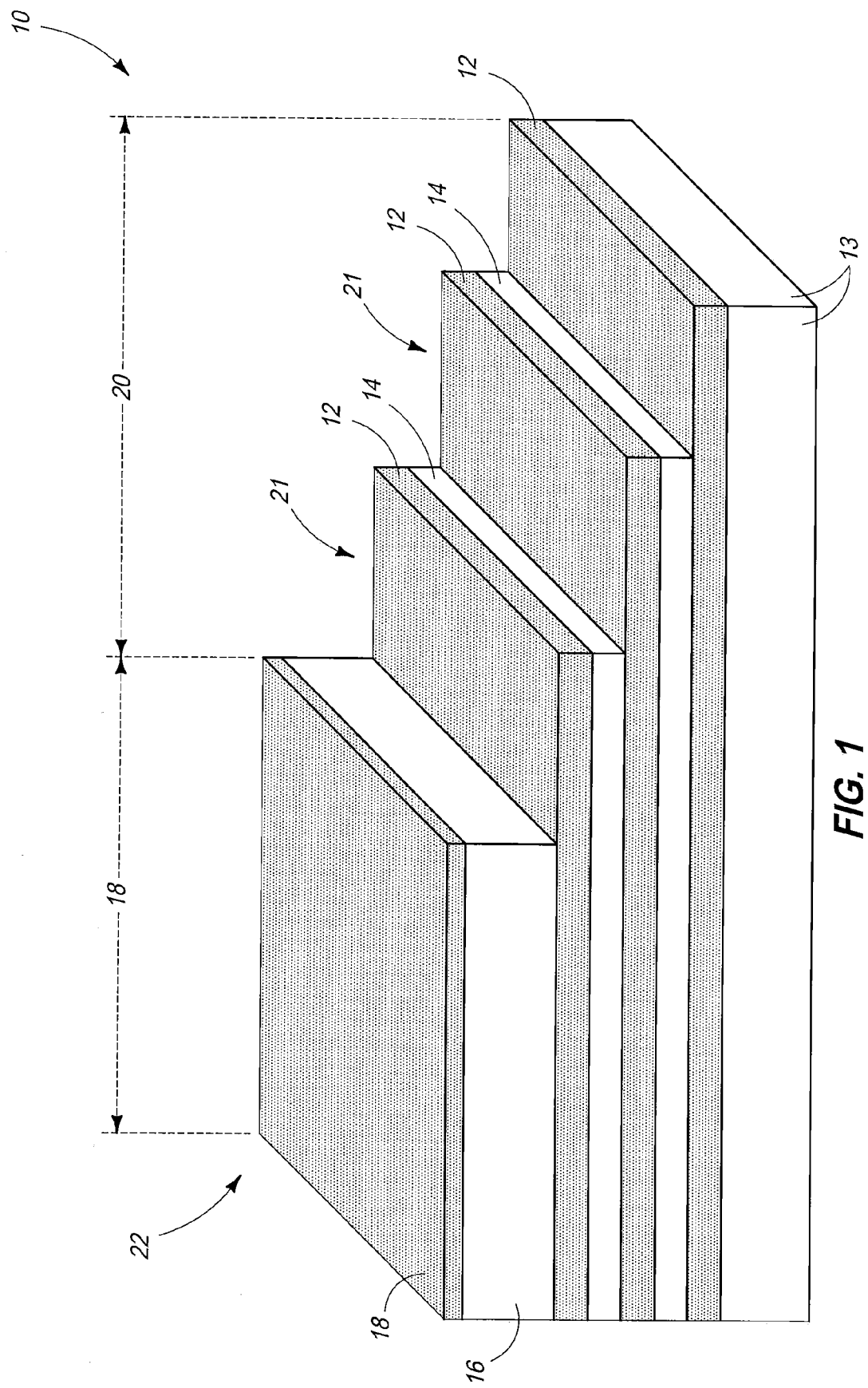
FIG. 1 is a diagrammatic oblique view of a semiconductor substrate fragment in process in accordance with an embodiment of the invention.

Referring to FIG. 1, a substrate fragment 10 comprises a suitable base substrate 13 over which various materials have been provided. Base substrate 13 may be homogenous or non-homogenous, for example comprising multiple different composition materials and/or layers. As examples, such may comprise bulk monocrystalline silicon and/or a semiconductor-on-insulator substrate. As an additional example, such may comprise dielectric material having contacts (e.g., conductive vias) formed therein which extend vertically or otherwise into communicative contact (e.g., current conductive electrical connection) with device components, regions, or material that is elevationally inward of the dielectric material. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, "elevational" and "elevationally" are with reference to the vertical direction from a base substrate upon which the circuitry is fabricated.

The base substrate may or may not be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In one embodiment, substrate 10 comprises a stack of alternating sacrificial material 12 and dielectric material 14 formed over base substrate 13. Each material 12 and 14 may be homogenous or non-homogenous. In one embodiment, the respective sacrificial materials 12 are of the same composition relative one another. In one embodiment, the respective dielectric materials 14 are of the same composition relative one another. Regardless, sacrificial material 12 may be selectively etchable, in one embodiment highly selectively etchable, relative to dielectric material 14. In the context of this document, a "selective" etch requires removal of the stated one material relative to another at a rate of at least 1.5:1, and a highly selective etch at a rate of at least about 10:1. Sacrificial material 12 may be any one or more of conductive (e.g., current conductive), dielectric, or semiconductive. By way of an example only, dielectric material 14 may comprise silicon dioxide (whether doped or un-doped), and an example sacrificial material is a conductive or insulative nitride, for example titanium nitride or silicon nitride, respectively. A dielectric material 16 and a hardmask 18 have been provided outwardly of alternating materials 12, 14. Each material 16 and 18 may be homogenous or non-homogenous. Dielectric material 16 may be of the same composition as dielectric material 14, and hardmask material 18 may be of the same composition as sacrificial material 12. FIG. 1 depicts vertical tiers of three sacrificial materials 12 with two alternating dielectric materials 14. Additional alternating pairs of sacrificial and dielectric materials may be provided elevationally inward of innermost sacrificial material 12 or elevationally outward of outermost sacrificial material 12.

Stack of alternating materials 12, 14 may be considered as comprising a primary portion 18 and an end portion 20. The end portion in the depicted embodiment has been patterned to form a stair step-like construction. Such may be formed to provide horizontal area for later forming contacts to components, regions, or material in end portion 20 as will be apparent in the continuing discussion. In one embodiment and as shown, end portion 20 comprises individual stairs 21 which at least include sacrificial material 12.

In one embodiment, materials 12 and 14 may be features (e.g., plates), such as plates or features that are plate-like, whether continuously and/or discontinuously formed. In one embodiment, a method of forming circuitry components comprises forming a stack of horizontally extending and vertically overlapping plates at least some of which increase in horizontal extent in the vertical inward direction in the end portion of the stack (i.e., at least some of which extend farther in the horizontal direction in the end portion moving deeper into the stack in the end portion). Either of collective materials 12 or 14 may be considered in such example embodiment as comprising such plates, or materials 12 and 14 in combination in the depicted embodiment may be considered as such plates. In one embodiment, the horizontally extending and vertically overlapping plates are dielectric, for example plates 14 regardless of the composition of sacrificial material 12. In one embodiment, all of the plates increase in horizontal extent in the vertical inward direction in the end portion of the stack. For example in the embodiment of FIG. 1, either of collective plates 12 or collective plates 14 may be considered as plates all of which increase in horizontal extent progressing vertically inward in the end portion of the stack. Alternately, a composite of each immediately adjacent plate pairs 12, 14 may be considered as respective plates which increase in horizontal extent in the vertical inward direction in end portion 20 of the stack.

In one embodiment, primary portion 18 and end portion 20 comprise a portion of an array area 22 within which a plurality of memory cells will be fabricated. Logic circuitry (not shown) may be fabricated outside of the array area. Control and/or other peripheral circuitry (not shown) for operating the memory array may or may not fully or partially be within the array area, with an example array area as a minimum encompassing all of the memory cells of the given array/sub-array. Further, multiple sub-arrays might also be fabricated and operated independently, in tandem, or otherwise relative one another. As used in this document, a "sub-array" may also be considered as an array.

Figure 2:
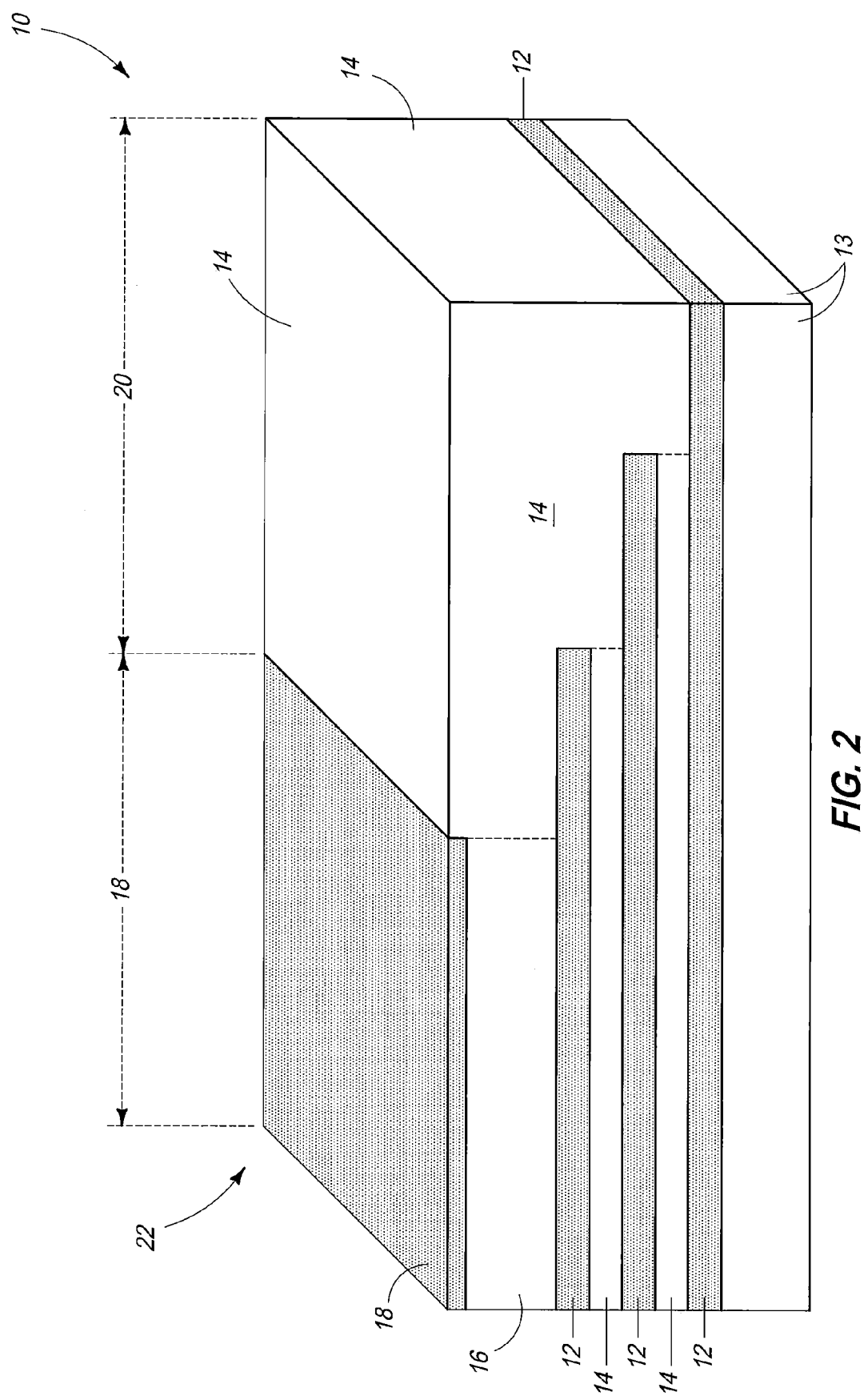
FIG. 2 is a view of the FIG. 1 substrate at a processing step subsequent to that shown by FIG. 1.

Referring to FIG. 2, dielectric material has been formed over substrate 10 and planarized at least to the outermost surface of hardmask 18. The dielectric material may be homogenous or non-homogenous and, in one embodiment, may be of the same composition as that of material 14 and is so shown and designated in the figures.

Figure 3:
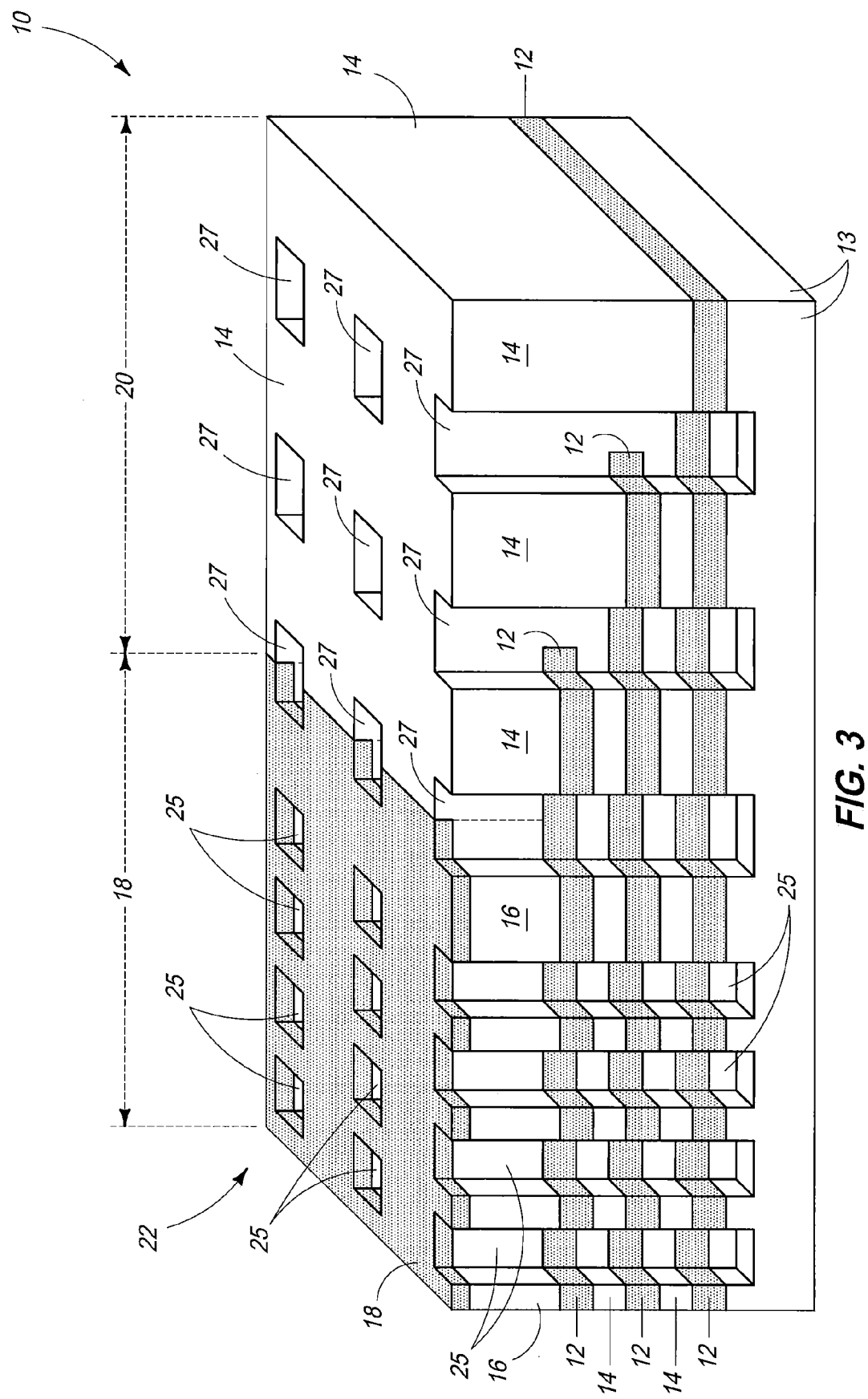
FIG. 3 is a view of the FIG. 2 substrate at a processing step subsequent to that shown by FIG. 2.

Referring to FIG. 3, first openings 25 have been formed into primary portion 18 of the stack and second openings 27 have been formed into end portion 20 of the stack. Any openings which overlap the primary and end portions may be such first or second openings (i.e., as primary portion openings or end portion openings), with example such openings being shown in FIG. 3 and designated as second openings 27. Openings 25, 27 may be formed through each plate 12, 14. An example technique for forming openings 25, 27 is by photolithographic patterning followed by subtractive anisotropic etching. First openings 25 need not be of the same shape and/or density relative one another. Second openings 27 need not be of the same shape and/or density relative one another, or relative to any one or more of first openings 25. As examples, openings 25 and 27 may be formed to have the same horizontal and vertical cross sections (not shown). Alternately, openings 25 and 27 may be formed to have at least one of different horizontal cross sections (as shown) or different vertical cross sections (as shown). Further and regardless, openings 25 and 27 may be formed at the same time or at different times, and/or may use the same masking step or different masking steps where, for example, photolithographic or other masking is used. In one embodiment and as shown, at least some of openings 27 in end portion 20 are formed to horizontally overlap ends of individual plates 12 and/or 14.

At least one of conductive material, semiconductive material, and programmable material is/are deposited into the openings. In one embodiment where conductive material is deposited into the openings, such may comprise current conductive material. In the context of this document, current conductive material can include a composition where electric current flow may inherently occur therein predominantly by movement of subatomic positive and/or negative charges when such are generated as opposed to predominantly by movement of ions. Example current conductive materials are elemental metals, alloys of elemental metals, current conductive metal compounds, and conductively doped semiconductive material, including any combinations thereof.

In one embodiment, the depositing of the conductive material, semiconductive material and/or programmable material occurs simultaneously into all of the openings in the primary portion. In one embodiment, the depositing of such material occurs simultaneously into all of the openings in the end portion. In one embodiment, the depositing of such material occurs simultaneously into all of the openings in both of the primary and end portions. Operative structures (e.g., circuit components, such as local vertical extensions) are formed therewith within the openings in the primary portion, and dummy structures (e.g. dummy vertical extensions) are formed therewith within the openings in the end portion. In the context of this document, a "dummy" structure is a structure which is used to mimic a physical property of another structure (e.g., load carrying ability of an operative structure) and which may comprise a circuit inoperable electrical dead end (e.g., is not part of a current flow path of a circuit even if conductive). Openings in which dummy structures are formed may be considered as "dummy openings".

Figure 4:
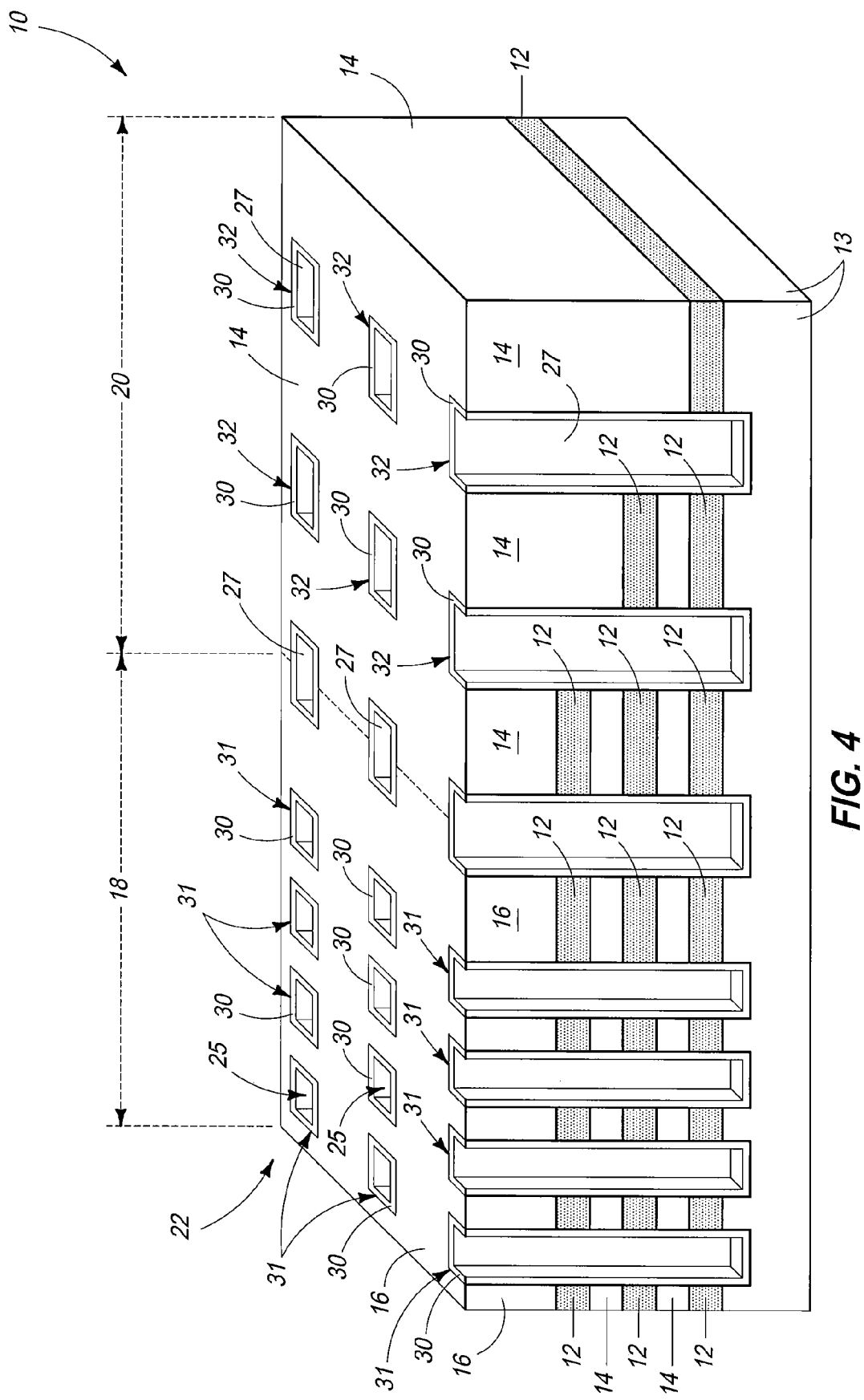
FIG. 4 is a view of the FIG. 3 substrate at a processing step subsequent to that shown by FIG. 3.
Figure 5:
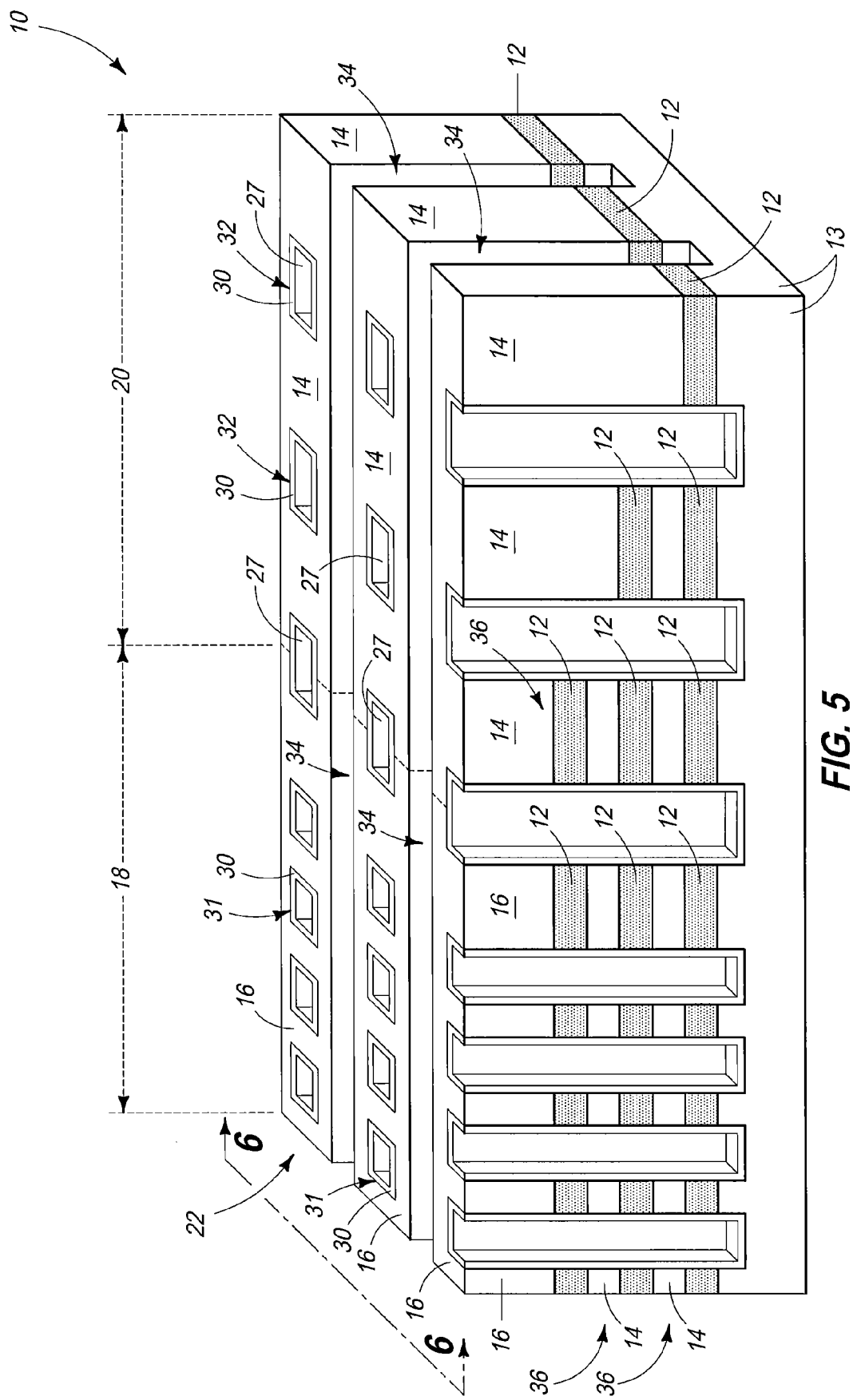
FIG. 5 is a view of the FIG. 4 substrate at a processing step subsequent to that shown by FIG. 4.
Figure 6:
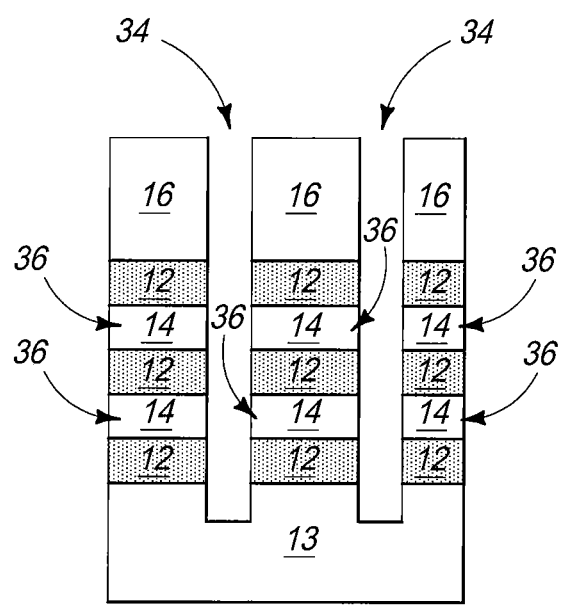
FIG. 6 is an end view of FIG. 5 relative to line 6-6 in FIG. 5.

For example referring to FIG. 4, a material 30 has been deposited within openings 25, 27, and then planarized back through hardmask material 18 (not shown). An example thickness for material 30 is from about 100 to about 150 Angstroms. Material 30 may be homogenous or non-homogenous, and may comprise one or more of conductive material (e.g., current conductive material), semiconductive material, and programmable material. In one embodiment, material 30 comprises semiconductive material. Further in such embodiment, the semiconductive material may comprise interconnected channels of a plurality of vertically oriented transistors, and in one embodiment comprises interconnected channels of vertically oriented charge storage transistors as will be apparent from the continuing discussion. Regardless, in one embodiment, material 30 may form operative structures 31 (e.g., operative circuit components 31) within primary portion openings 25 and form dummy structures 32 (e.g., dummy circuit components) within end portion openings 27. In one embodiment and as shown, such operative structures 31 and dummy structures 32 are in the form of hollow cylinders. Alternately by way of example, such may be in the form of laterally solid pillars (not shown in FIG. 4). Regardless, the above processing describes but examples of forming operative structures 31 vertically through plates 12 and/or 14 in primary portion 18 and forming dummy structures 32 vertically through plates 12 and/or 14 in end portion 20. In one embodiment, the operative and dummy structures may comprise the same material (as shown). In one embodiment, the operative and dummy structures may comprise a plurality of the same materials (not shown in FIG. 4), and in one such embodiment be arranged in the same lateral order relative one another in the operative and dummy structures. In one embodiment, the operative and dummy structures may consist essentially of the same material.

Figure 7:
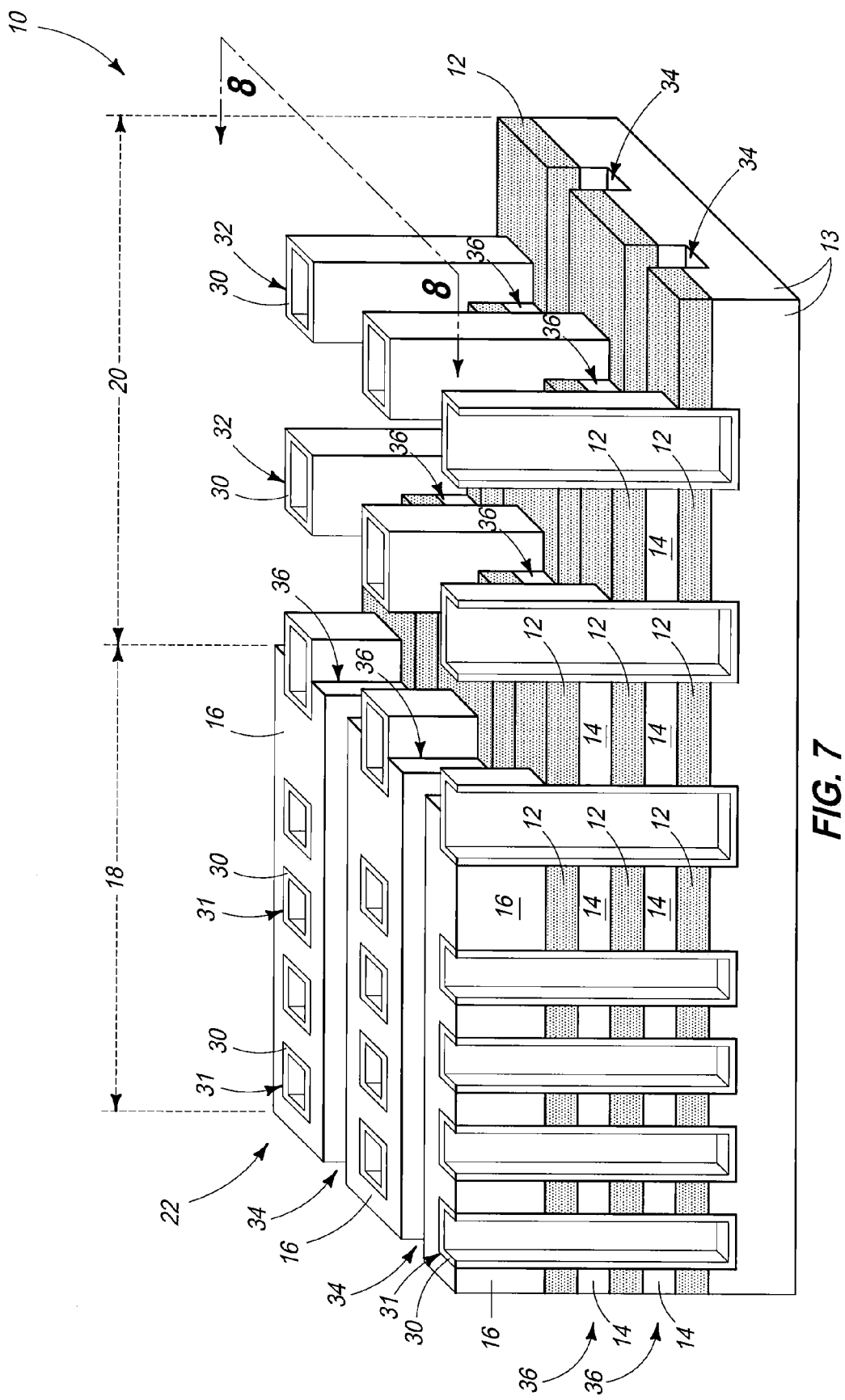
FIG. 7 is a view of the FIG. 5 substrate wherein certain material in FIG. 5 is not shown in FIG. 7 solely for clarity.
Figure 8:
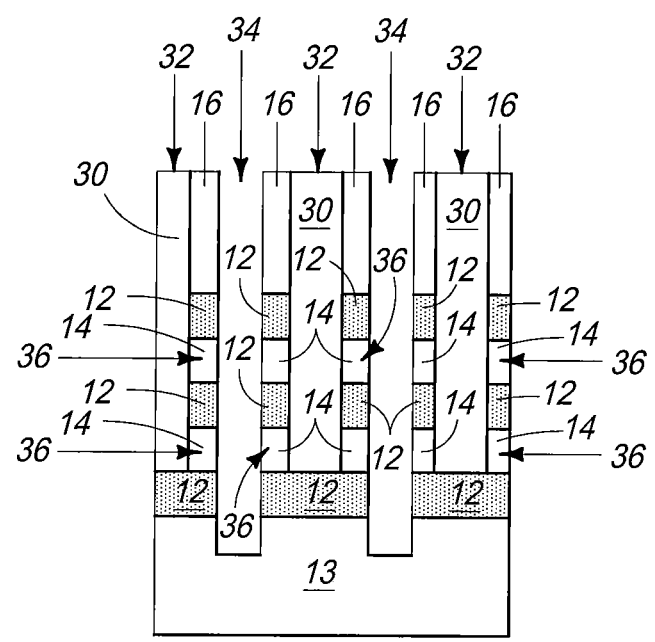
FIG. 8 is an end view of FIG. 7 relative to line 8-8 in FIG. 7.

Referring to FIGS. 5-8, horizontally elongated openings 34 (e.g., trenches) have been formed through plates 12 and/or 14, and laterally between material 30, to form horizontally elongated and vertically overlapping lines 36 from material of the plates. Lines 36 individually extend from primary portion 18 into end portion 20 and individually laterally about sides of vertically extending portions of both operative structures 31 and dummy structures 32. FIGS. 7 and 8 are views of FIGS. 5 and 6, respectively, wherein dielectric material 14 added in FIG. 2 is removed solely for clarity in such drawings. Where either of operative structures 31 or dummy structures 32 are upwardly open (e.g., as shown), such may be partially or wholly filled (not shown) with dielectric and/or other material prior to the forming of horizontally elongated openings 34.

Figure 9:
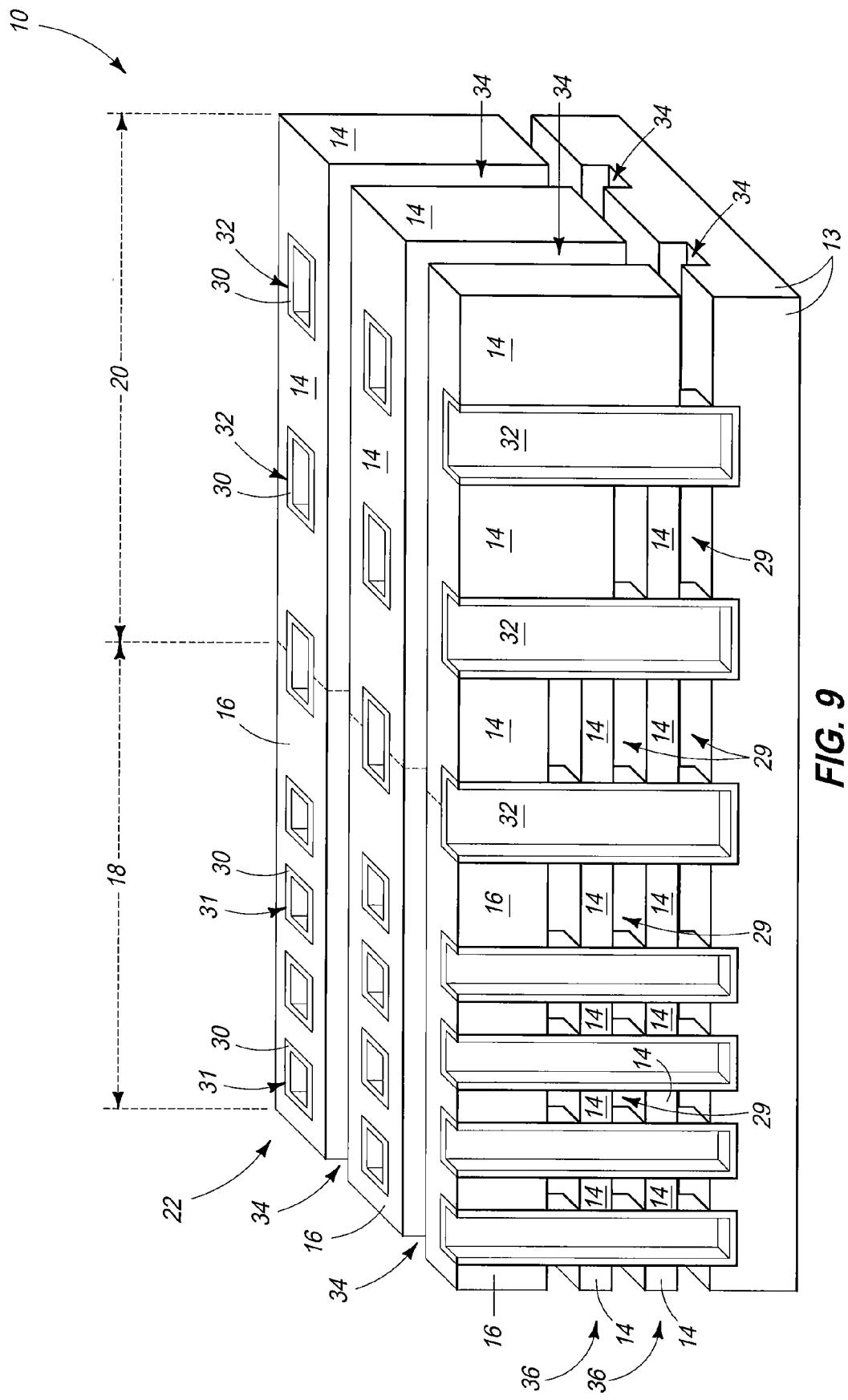
FIG. 9 is a view of the FIG. 7 substrate at a processing step subsequent to that shown by FIG. 7.
Figure 10:
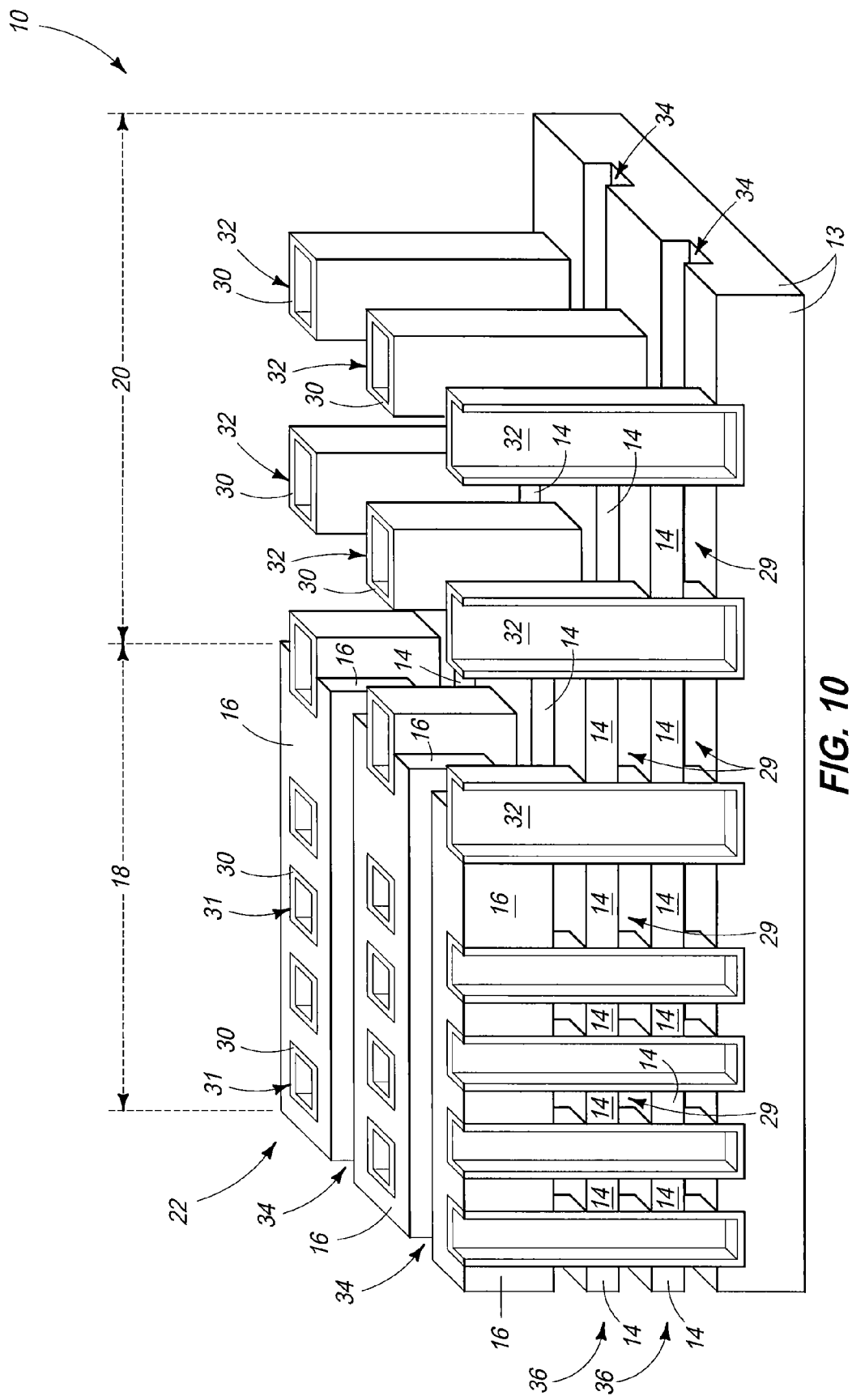
FIG. 10 is a view of the FIG. 9 substrate wherein certain material in FIG. 9 is not shown in FIG. 10 solely for clarity.

Referring to FIGS. 9 and 10, at least some of sacrificial material 12 that is elevationally between lines 36 within primary portion 18 and end portion 20 has been removed from being laterally between horizontally elongated openings 34. Such thereby, in one embodiment, forms void spaces 29 elevationally between vertically spaced horizontal dielectric lines 36. An example technique includes etching, for example isotropic dry and/or wet etching. Etching may be conducted selectively (ideally, highly selectively) relative to lines 36, operative structures 31, and dummy structures 32. FIG. 10 is a view of the FIG. 9 substrate wherein dielectric material 14 added in FIG. 2 is removed solely for clarity in such drawing.

The above processing discloses but example embodiments of forming circuitry components in accordance with some aspects of the invention. In one embodiment, a method of forming circuitry components comprises forming a stack of horizontally extending and vertically overlapping features. By way of example only, such features may comprise plates, with the example depicted structure of plates 14 comprising but one example of such plates. Regardless, in such embodiment, the stack comprises a primary portion and an end portion wherein at least some of the features increase in horizontal extent in the vertical inward direction in the end portion of the stack (i.e., at least some of which extend farther in the horizontal direction in the end portion moving deeper into the stack in the end portion). Operative structures 31 (e.g., circuit components) are formed vertically through the features in the primary portion and dummy structures 32 (e.g., dummy circuit components) are formed vertically through the features in the end portion. The processing depicted through FIG. 4, or through FIGS. 5-8, are examples. The operative and dummy structures may comprise the same material, and in one embodiment may consist essentially of the same material. The dummy structures may support material of the features from vertical movement in the end portion while at least some of sacrificial material that is elevationally between the material of the features in the primary and end portions is removed. The processing depicted in going from that of FIGS. 5-8 to that of FIGS. 9 and 10 is but one such example processing. With respect to a prior art problem, dummy structures heretofore have not been provided in a stair-like end portion of an array. Accordingly, the floors/ceilings that are vertically between the respective void spaces 29 in FIGS. 9 and 10 may be sagged, bent, or broken during processing due to lack of support. In accordance with one embodiment of the invention, dummy structures in the end portion support the features (e.g., the respective ceilings and floors, or plates) from vertical movement, for example by laterally engaging side portions of such floors/ceilings that were created where such dummy structures extend there-through. Regardless, other attributes as described may be employed.

Figure 11:
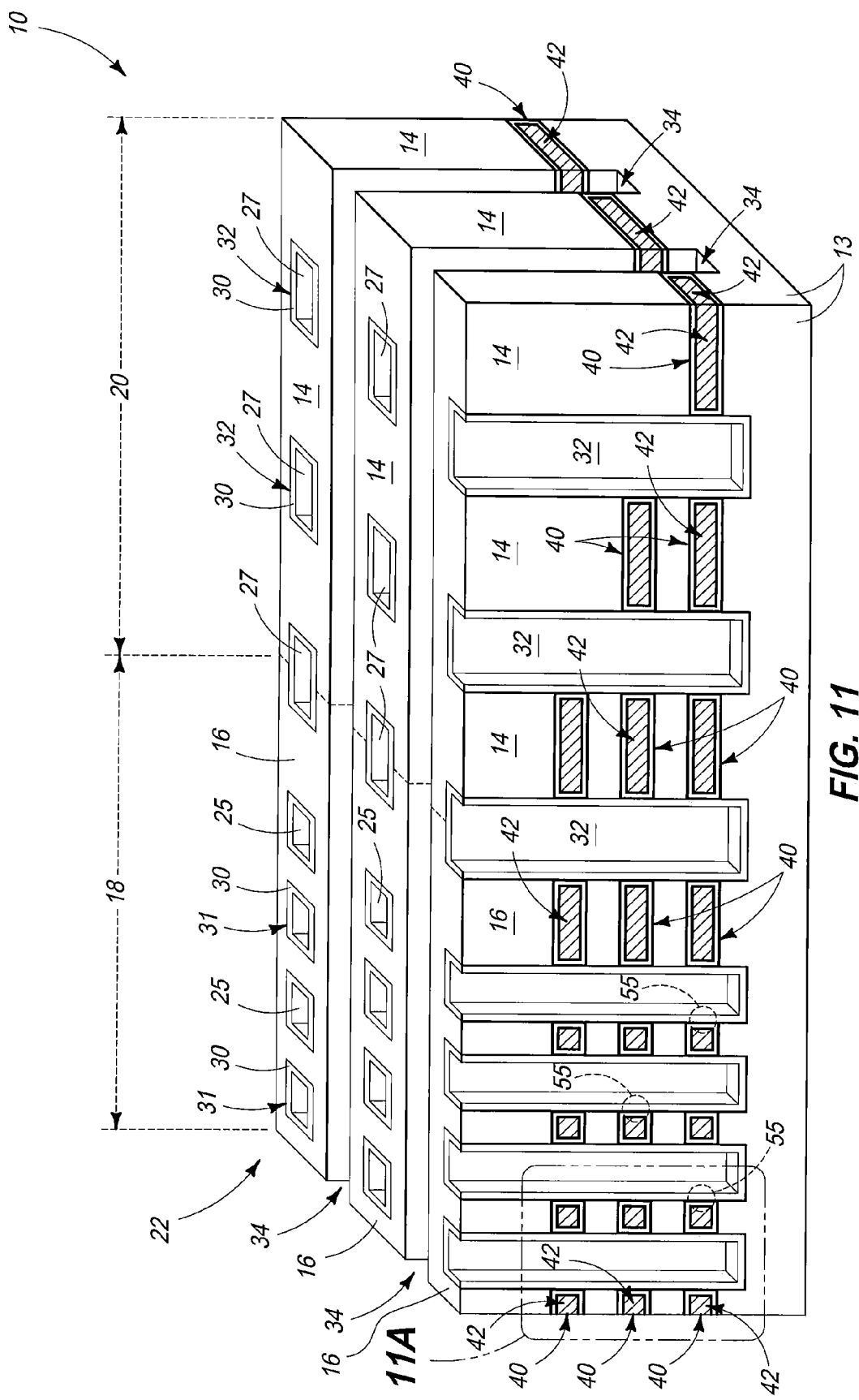
FIG. 11 is a view of the FIG. 9 substrate at a processing step subsequent to that shown by FIG. 9.
Figure 11A:
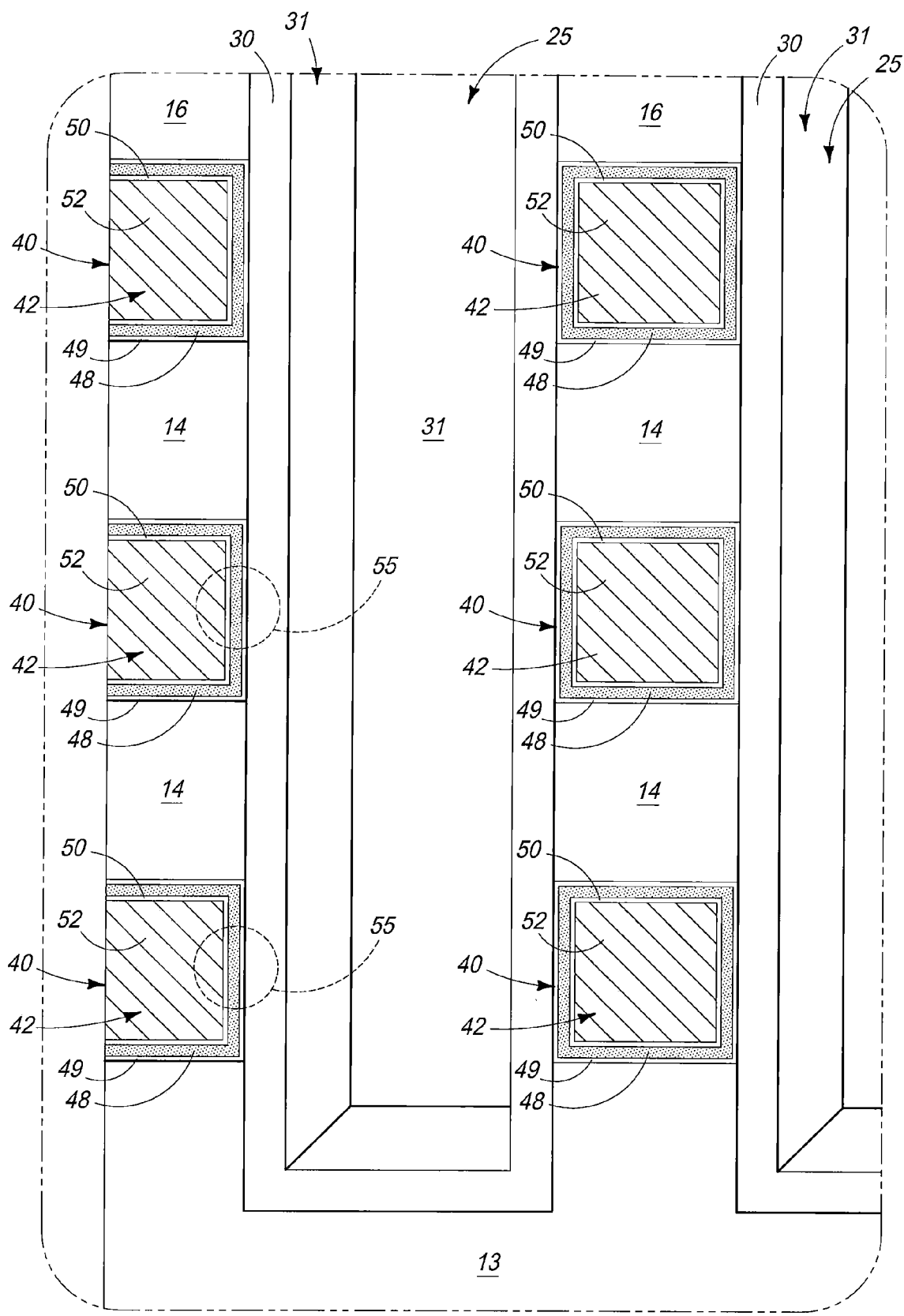
FIG. 11A is an enlarged view of a portion of FIG. 11.
Figure 12:
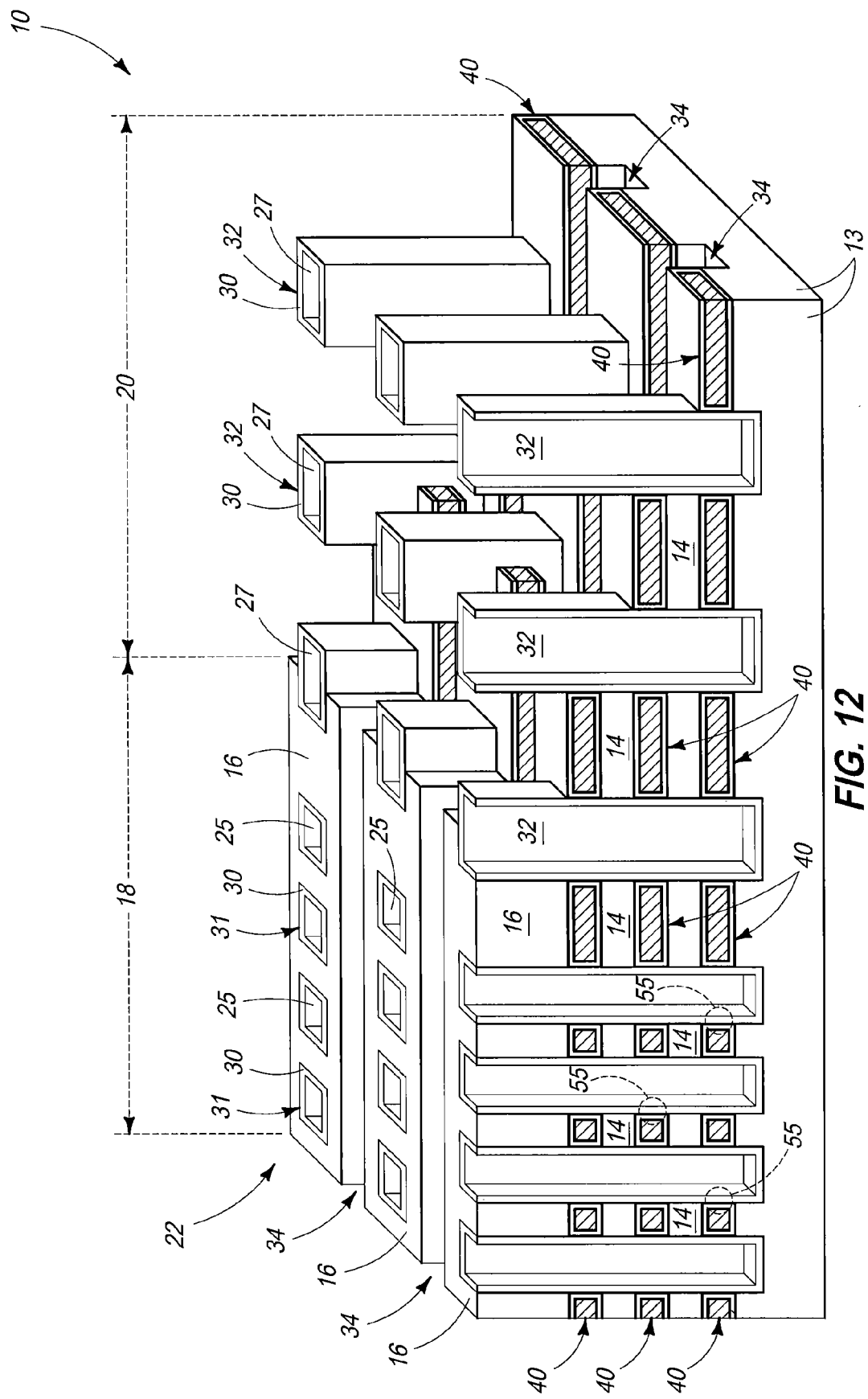
FIG. 12 is view of the FIG. 11 substrate wherein certain material in FIG. 11 is not shown in FIG. 12 solely for clarity.
Figure 13:
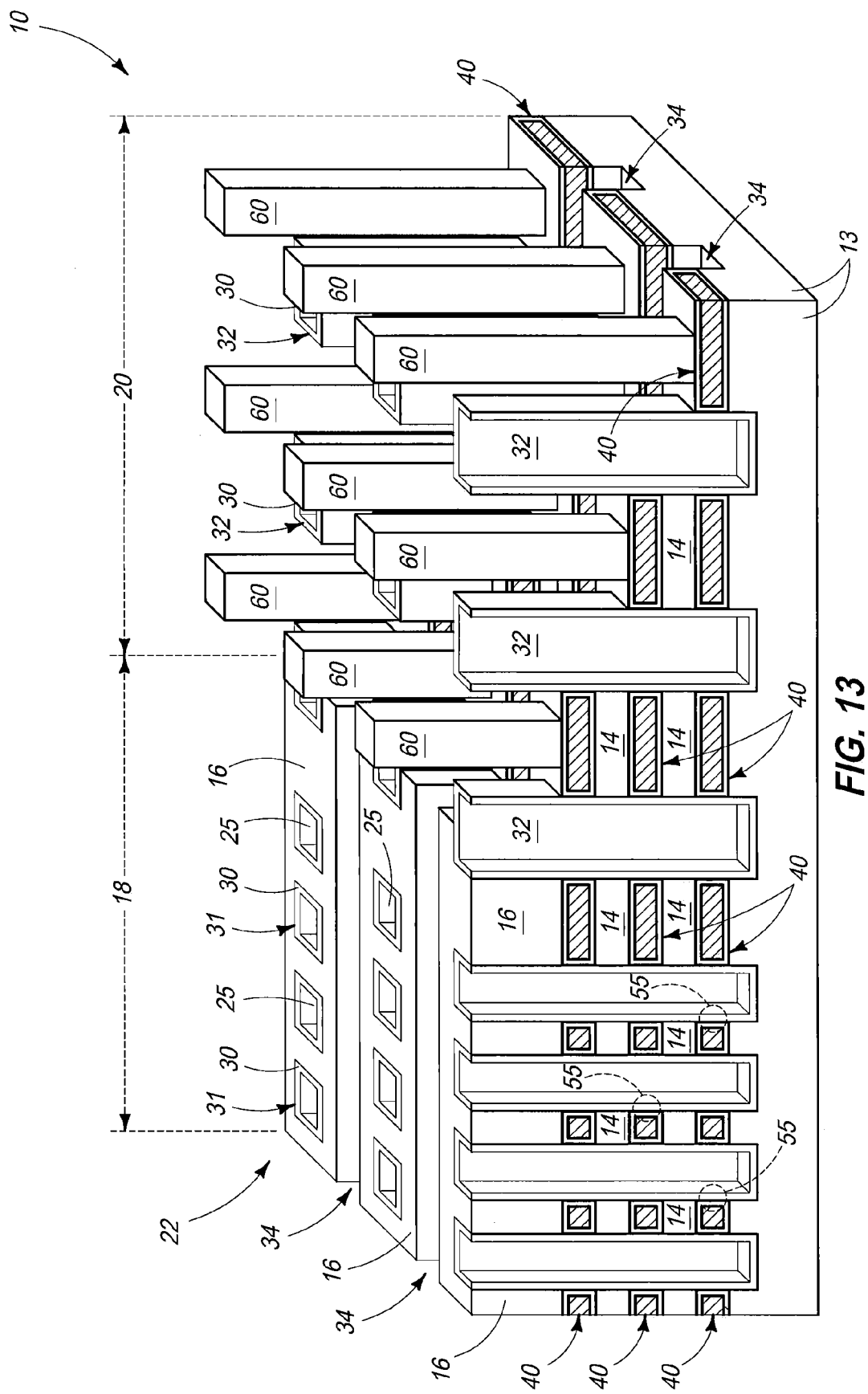
FIG. 13 is a view of the FIG. 12 substrate at a processing step subsequent to that shown by FIG. 12.

Additional processing may occur in fabricating integrated circuitry, for example in fabricating an array of memory cells as next described with reference to FIGS. 11-13. Referring to FIGS. 11 and 11A, material 40 has been isotropically deposited within horizontally elongated openings 34, former void spaces 29 (not shown in FIGS. 11, 11A), and any remaining volume of openings 25, 27. Material 40 has subsequently been removed from horizontally elongated openings 34 to form vertically spaced horizontal conductive lines 42 within the void spaces elevationally between horizontal lines 36 of dielectric material 14. In one embodiment, conductive lines 42 collectively cross a row of the operative and dummy structures at different respective elevations. In one embodiment, individual structures 31, 32 cross different conductive lines at different respective elevations. In the depicted example, conductive lines 42 extend longitudinally straight linear. Alternately by way of example, some or all of lines 42 may not be straight linear, for example being longitudinally curvilinear (not shown). Material 40 may also be removed from the remaining internal volume of openings 25, 27 as shown. FIG. 12 depicts the circuitry of FIG. 11 wherein the dielectric material that is shown as being deposited in FIG. 2 is removed solely for clarity.

FIGS. 11, 11A, and 12 depict but one example embodiment comprising NAND circuitry wherein operative structures 31 comprise interconnected channel regions of a NAND string. In such example embodiment, material 40 comprises a composite of a suitable tunnel dielectric 49 (FIG. 11A), floating gate/charge trapping material 48, dielectric 50, and conductive control gate material 52. Thereby, conductive material 52 provides but an example conductive portion of conductive lines 42 that is within the void spaces between the horizontal lines of dielectric material, and which collectively cross a row of the operative and dummy structures at different respective elevations. Individual ones of the memory cells of the example circuitry of FIGS. 11 and 11A comprise an intersection of an individual horizontal conductive line and an individual operative structure (e.g., in the form of a string of channels of NAND), and some of which are indicated with reference numeral 55.

In one embodiment, a respective contact may be formed to a stair extension of individual ones of horizontal conductive lines 42 in end portion 20 for making communicative connection to circuitry. One such example is diagrammatically shown in FIG. 13. The dielectric material 14 of FIG. 2 is again showed removed solely for clarity in depicting certain components. Specifically, FIG. 13 shows example individual contacts 60 (e.g., current conductive contacts) which may be formed through the dielectric material 14 (not shown) of FIG. 2 for making communicative connection to circuitry, such as that elevationally outward of that depicted by FIG. 13 with respect to each conductive line 42.

Circuitry components other than or in addition to components of memory cells may be fabricated in accordance with embodiments of the invention.

Figure 14:
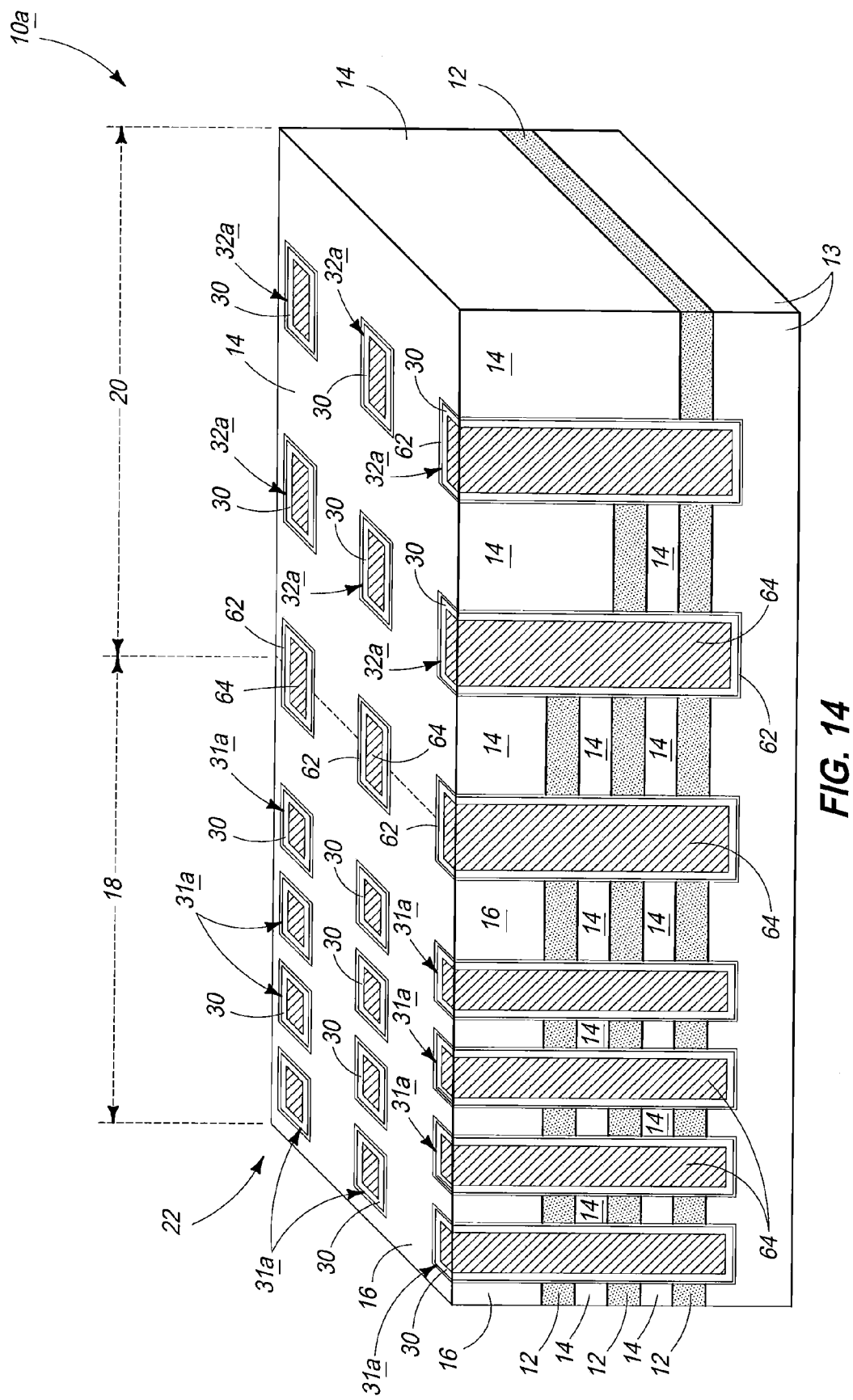
FIG. 14 is a diagrammatic perspective view of a semiconductor substrate fragment in process in accordance with an embodiment of the invention.

An example embodiment of a method of forming an array of cross-point memory cells is next described with reference to FIGS. 14-17. Like numerals from the above-described embodiments have been used where appropriate, with some construction differences being indicated with the suffix "a" or with different numerals. FIG. 14 depicts an alternate embodiment substrate fragment 10a to that depicted by FIG. 4. In FIG. 14, openings 25, 27 have been lined with a first material 62. In one embodiment, such material is dielectric (i.e., a 15 to 30 Angstroms thick layer of undoped silicon dioxide). Thereafter, a programmable material 30 was deposited to line over first material 62 within openings 25, 27. Then, remaining volume of openings 25, 27 has been filled with conductive material 64, and materials 62, 30, and 64 planarized back to materials 14 and 16. Horizontally elongated openings (not shown in FIG. 14) may then be formed analogous to the processing depicted by FIGS. 5-8.

Programmable material 30 may be solid, gel, amorphous, crystalline, or any other suitable phase. Any existing or yet-to-be developed programmable material may be used, with only some examples being provided below.

One example programmable material is ion conductive material. Example suitable such materials comprise chalcogenide-type (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and CuTe) and/or oxides such as zirconium oxide, hafnium oxide, tungsten oxide, copper oxide, niobium oxide, iron oxide, silicon oxide (specifically, silicon dioxide), gadolinium oxide, etc. capable of inherently (or with additive) supporting electrolyte behavior.

Such may have silver, copper, cobalt, and/or nickel ions, and/or other suitable ions, diffused therein for ionic conduction, analogously to structures disclosed in U.S. Pat. No. 7,405,967 and U.S. Patent Publication Number 2010/0193758.

Additional example programmable materials include multi-resistive state metal oxide-comprising material. Such may comprise, for example, at least two different layers or regions generally regarded as or understood to be active or passive regions, although not necessarily. Alternately, such may only comprise active material. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $SrZrO_3$, $BaTiO_3$, $Ba_{(1-x)}Sr_x$-$TiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, a programmable material composite might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019. Further as is conventional, multi-resistive state metal oxide-comprising materials encompass filament-type metal oxides, ferroelectric metal oxides and others, and whether existing or yet-to-be developed, as long as resistance of the metal oxide-comprising material can be selectively changed.

The programmable material may comprise memristive material. As an example, such material may be statically programmable semiconductive material which comprises mobile dopants that are received within a dielectric such that the material is statically programmable between at least two different resistance states. At least one of the states includes localization or gathering of the mobile dopants such that a dielectric region is formed and thereby provides a higher resistance state. Further, more than two programmable resistance states may be used. In the context of this document, a "mobile dopant" is a component (other than a free electron) of the semiconductive material that is movable to different locations within said dielectric during normal device operation of repeatedly programming the device between at least two different static states by application of voltage differential to the pair of electrodes. Examples include atom vacancies in an otherwise stoichiometric material, and atom interstitials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms in amorphous or crystalline oxides. More than one type of mobile dopant may be used. Example dielectrics in which the mobile dopants are received include suitable oxides, nitrides, and/or fluorides that are capable of localized electrical conductivity based upon sufficiently high quantity and concentration of the mobile dopants. The dielectric within which the mobile dopants are received may or may not be homogenous independent of consideration of the mobile dopants. Specific example dielectrics include $TiO_2$, AlN, and/or $MgF_2$. Example programmable materials that comprise oxygen vacancies as mobile dopants may comprise a combination of $TiO_2$ and $TiO_{2-x}$ in at least one programmed resistance state depending on location of the oxygen vacancies and the quantity of the oxygen vacancies in the locations where such are received. An example programmable material that comprises nitrogen vacancies as mobile dopants is a combination of AlN and $AlN_{1-x}$ in at least one programmed state depending on location of the nitrogen vacancies and the quantity of the nitrogen vacancies in the locations where such are received. An example programmable material that comprises fluorine vacancies as mobile dopants may is a combination of $MgF_2$ and $MgF_{2-x}$ in at least one programmed resistance state depending on location of the fluorine vacancies and the quantity of the fluorine vacancies in the locations where such are received. As another example, the mobile dopants may comprise aluminum atom interstitials in a nitrogen-containing material.

Still other example programmable materials include polymer materials such as Bengala Rose, $AlQ_3Ag$, Cu-TCNQ, DDQ, TAPA, and fluorescene-based polymers.

Figure 15:
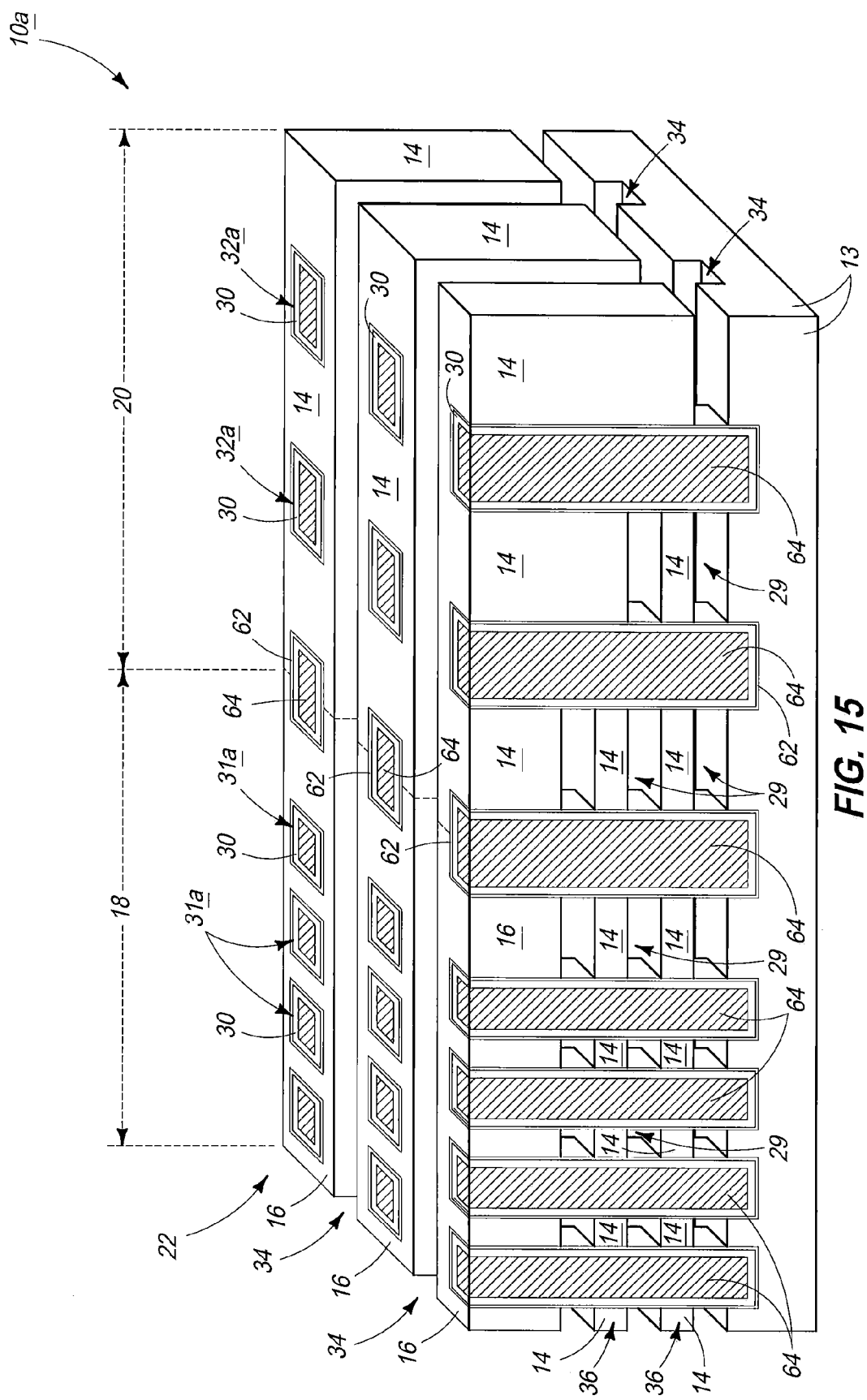
FIG. 15 is a view of the FIG. 14 substrate at a processing step subsequent to that shown by FIG. 14.

Referring to FIG. 15, such corresponds in processing sequence to that of FIG. 9 of the above-described embodiments. Sacrificial material 12 (not shown) has been at least partially removed (e.g., by etching) between dielectric lines 36 in primary portion 18 and end portion 20 laterally between horizontally elongated openings 34. Material 12 may be etched selectively (ideally, highly selectively) relative to dielectric lines 36, first material lining 62, and conductive material 64 in openings 25, 27. FIGS. 14 and 15 depict an example embodiment wherein the operative and dummy structures comprise a plurality of the same materials, and in such embodiment arranged in the same lateral order relative one another in the operative and dummy structures. Regardless, in one embodiment, first material lining 62 may serve as a protecting barrier from adverse exposure of programmable material 30 to the etching chemistry which etches the sacrificial material.

Figure 16:
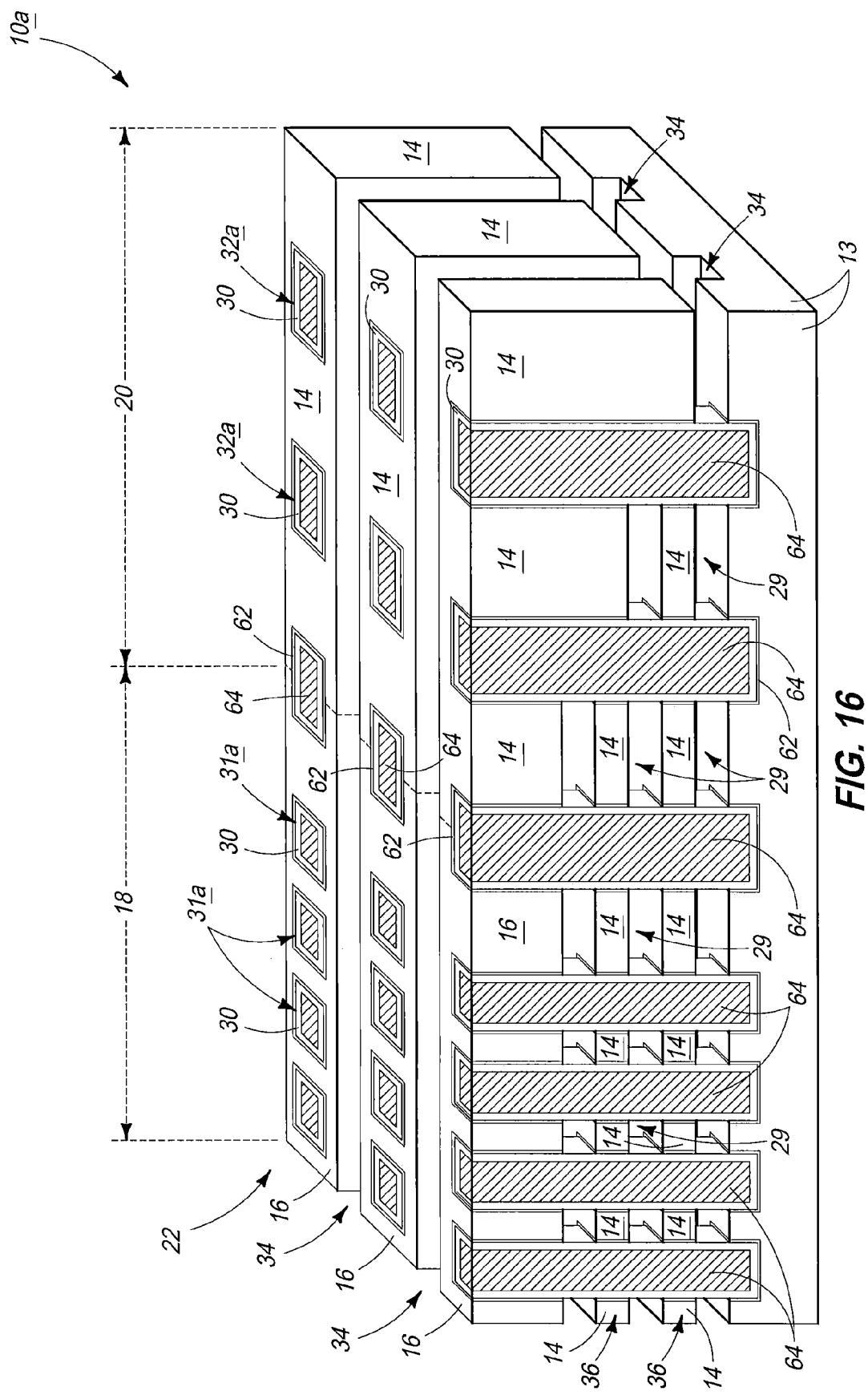
FIG. 16 is a view of the FIG. 15 substrate at a processing step subsequent to that shown by FIG. 15.
Figure 17:
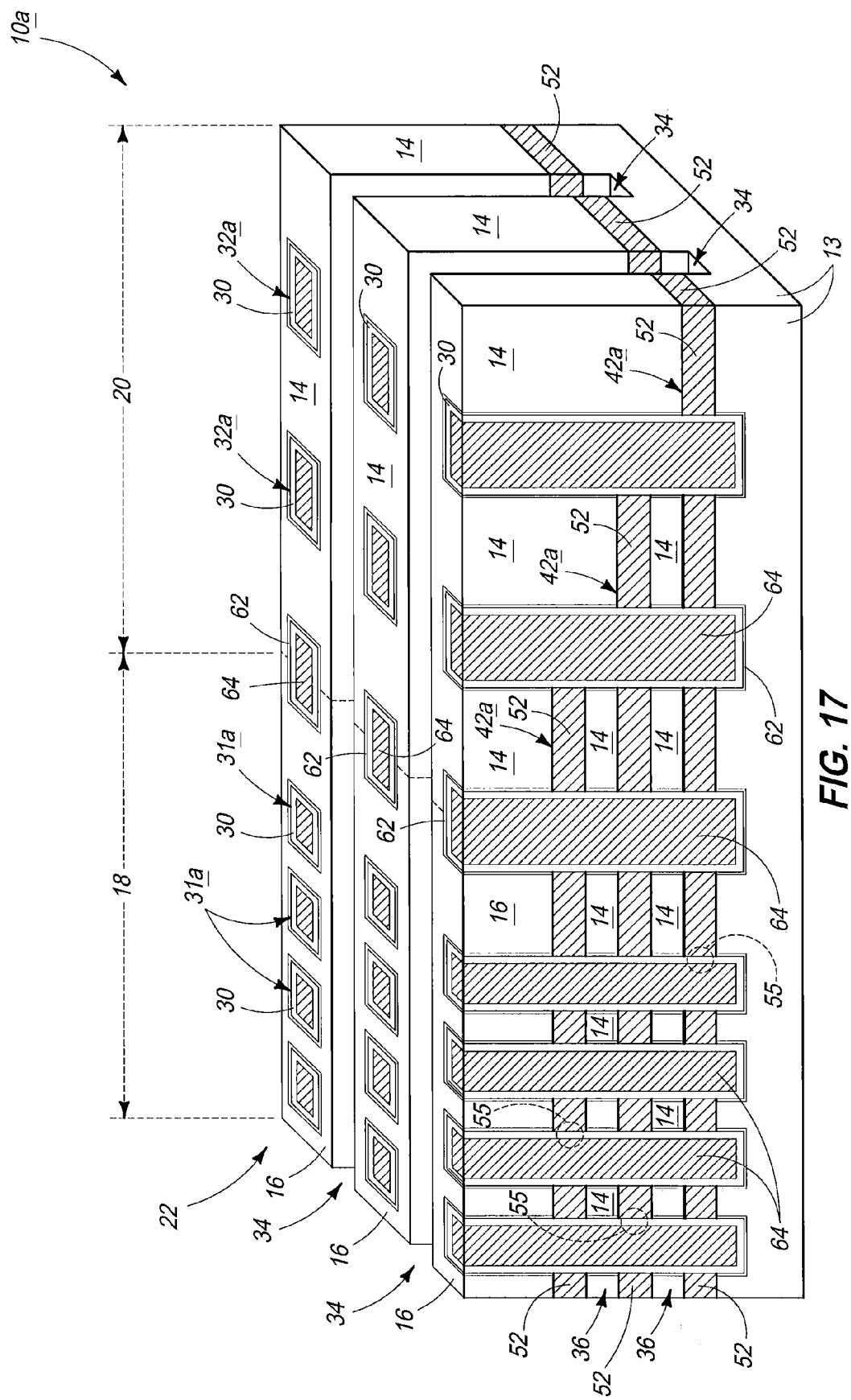
FIG. 17 is a view of the FIG. 16 substrate at a processing step subsequent to that shown by FIG. 16.

Referring to FIG. 16, at least a portion of first material 62 has been removed elevationally between dielectric lines 36 to expose laterally outer sidewalls of programmable material 30 that is elevationally between dielectric lines 36. An example technique for doing so where material 62 comprises silicon dioxide includes etching with a dilute HF solution.

Referring to FIG. 17, at least a portion of sacrificial material 12 (not shown) of FIG. 14 has been replaced with conductor material 52 (e.g., current conductive material) that is in electrical connection with the laterally outer sidewalls of programmable material 30 and to comprise vertically spaced horizontal conductive lines 42a. Materials 64 and 52 may be of the same composition or of different compositions. Further and regardless, conductive material 64 within remaining volumes of openings 25, 27 alternately may be provided subsequent to the etching depicted by FIG. 15. Regardless, FIG. 17 also depicts conductor material 52 as having been at least partially removed from horizontally elongated openings 34 to form such vertically spaced horizontal conductive lines 42a.

Individual ones of the cross-point memory cells comprise crossing ones of the horizontal conductive lines in the primary portion and conductive material in the openings in the primary portion having the programmable material therebetween, with some of such example memory cells being indicated with reference numeral 55 in the FIG. 17 example embodiment.

An embodiment of the invention includes a stack of horizontally extending and vertically overlapping features. The stack comprises a primary portion and an end portion. At least some of the features extend farther in the horizontal direction in the end portion moving deeper into the stack in the end portion. Operative structures extend vertically through the features in the primary portion. Dummy structures extend vertically through the features in the end portion. In one embodiment, the features may be horizontally extending lines, for example formed of any one or combination of conductive (e.g., current conductive), semiconductive, and/or dielectric material(s). In one embodiment, the features comprise a combination of horizontally extending conductive and dielectric lines (e.g., overlapping and alternating such lines). In one embodiment, contacts may be in the end portion, for example extending vertically to the lines. Any other attribute as described above may be used, for example as shown and described with respect to FIGS. 1-13 and with respect to FIGS. 14-17.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of cross-point memory cells, comprising:
    forming a stack of horizontally extending and vertically overlapping dielectric features, the stack comprising a primary portion and an end portion, at least some of the dielectric features extending farther in the horizontal direction in the end portion moving deeper into the stack in the end portion;
    forming openings through the dielectric features in the primary portion and in the end portion;
    lining the openings with first material;
    lining the first material-lined openings with programmable material;
    filling remaining volume of the first and programmable material-lined openings with conductive material;
    forming horizontally elongated trenches through the dielectric features to form horizontally elongated and vertically overlapping dielectric lines from dielectric material of the dielectric features, the dielectric lines individually extending from the primary portion into the end portion and individually laterally about sides of both the openings in the primary and end portions;
    removing at least some of sacrificial material that is elevationally between the dielectric lines in the primary and end portions laterally between the trenches selectively relative to the dielectric lines and the first material lining in the openings;
    after removing at least a portion of the sacrificial material, removing at least a portion of the first material that is elevationally between the dielectric lines to expose laterally outer sidewalls of the programmable material that is elevationally between the dielectric lines; and
    replacing at least a portion of the sacrificial material with conductor material that is in electrical connection with the laterally outers sidewalls of the programmable material and to comprise vertically spaced horizontal conductive lines; individual ones of the cross-point memory cells comprising crossing ones of the horizontal conductive lines in the primary portion and conductive material in the openings in the primary portion having the programmable material there-between.

2. The method of claim 1 comprising forming the trenches after the filling.

3. The method of claim 1 wherein the conductive material and the conductor material are of the same composition.

4. The method of claim 1 wherein the conductive material and the conductor material are of different compositions.

5. The method of claim 1 wherein the first material is dielectric.

6. The method of claim 1 wherein the features comprise plates.

7. The method of claim 1 comprising forming the primary portion openings and the end portion openings at the same time.

8. The method of claim 1 comprising forming the primary portion openings and the end portion openings at different times.

9. The method of claim 1 comprising forming at least some of the end portion openings to horizontally overlap ends of individual ones of the features.

10. The method of claim 1 comprising forming the primary portion openings and the end portion openings to have the same horizontal and vertical cross sections.

11. The method of claim 1 comprising forming the primary portion openings and the end portion openings to have at least one of different horizontal cross sections or different vertical cross sections.

12. A method of forming circuitry components, comprising:
    forming a stack of horizontally extending and vertically overlapping features, the stack comprising a primary portion and an end portion, at least some of the features extending farther in the horizontal direction in the end portion moving deeper into the stack in the end portion;
    forming first structures vertically through the features in the primary portion and forming second structures vertically through the features in the end portion;
    removing at least some sacrificial material that is elevationally between material of the features in the primary and end portions to form void spaces elevationally between the horizontally extending and vertically overlapping features; and
    forming conductor material within the void space and forming a stack of horizontally extending and vertically overlapping conductive lines from the conductor material.

13. The method of claim 12 comprising forming the conductive material of the conductive lines to horizontally wrap around the first structures.

14. The method of claim 12 comprising forming the first structures to at least initially comprise hollow cylinders.

15. The method of claim 14 comprising forming conductive material to extend vertically within the hollow cylinders.

16. The method of claim 15 wherein the conductive material is formed after forming the conductor material.

17. The method of claim 15 wherein the conductive material is formed before forming the conductor material.

18. A method of forming an array of cross-point memory cells, comprising:
    forming a stack of horizontally extending and vertically overlapping dielectric features, the stack comprising a primary portion and an end portion, at least some of the dielectric features extending farther in the horizontal direction in the end portion moving deeper into the stack in the end portion;
    forming openings through the dielectric features in the primary portion and in the end portion;
    lining the openings with first material;
    forming programmable material and conductive material within the first material-lined openings;
    forming horizontally elongated trenches through the dielectric features to form horizontally elongated and vertically overlapping dielectric lines from dielectric material of the dielectric features, the dielectric lines individually extending from the primary portion into the end portion and individually laterally about sides of both the openings in the primary and end portions;

removing at least some of sacrificial material that is elevationally between the dielectric lines in the primary and end portions laterally between the trenches selectively relative to the dielectric lines and the first material lining in the openings;

after removing at least a portion of the sacrificial material, removing at least a portion of the first material that is elevationally between the dielectric lines to expose laterally outer sidewalls of the programmable material that is elevationally between the dielectric lines; and replacing at least a portion of the sacrificial material with conductor material that is in electrical connection with the laterally outers sidewalls of the programmable material and to comprise vertically spaced horizontal conductive lines; individual ones of the cross-point memory cells comprising crossing ones of the horizontal conductive lines in the primary portion and conductive material in the openings in the primary portion having the programmable material there-between.

19. The method of claim 12 comprising forming the conductive lines to comprise conductive lines of cross-point memory cells.

* * * * *

UNITED STATES PATENT AND TRADEMARK OFFICE
CERTIFICATE OF CORRECTION

PATENT NO. : 9,318,430 B2  
APPLICATION NO. : 14/602559  
DATED : April 19, 2016  
INVENTOR(S) : Sanh D. Tang Page 1 of 1

It is certified that error appears in the above-identified patent and that said Letters Patent is hereby corrected as shown below:

Claims

Col. 11, line 58, claim 1, please delete "outers" after "laterally" and insert --outer--.

Col. 13, line 15, claim 18, please delete "outers" after "laterally" and insert --outer--.

Signed and Sealed this  
Twenty-third Day of August, 2016

Michelle K. Lee  
*Director of the United States Patent and Trademark Office*